(12) United States Patent
Chae et al.

(10) Patent No.: US 7,923,784 B2
(45) Date of Patent: Apr. 12, 2011

(54) SEMICONDUCTOR DEVICE HAVING SADDLE FIN-SHAPED CHANNEL AND METHOD FOR MANUFACTURING THE SAME

(75) Inventors: Kwang Kee Chae, Gyeonggi-do (KR); Jae Seon Yu, Gyeonggi-do (KR); Jae Kyun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 12/398,323

(22) Filed: Mar. 5, 2009

(65) Prior Publication Data

US 2010/0164051 A1    Jul. 1, 2010

(30) Foreign Application Priority Data

Dec. 30, 2008   (KR) ................ 10-2008-0137358

(51) Int. Cl.
*H01L 21/70* (2006.01)
*H01L 27/088* (2006.01)
*H01L 21/336* (2006.01)
*H01L 21/3205* (2006.01)

(52) U.S. Cl. ......... 257/368; 257/401; 438/270; 438/589
(58) Field of Classification Search .................. None
See application file for complete search history.

(56) References Cited

U.S. PATENT DOCUMENTS

| | | | | |
|---|---|---|---|---|
| 7,026,199 | B2* | 4/2006 | Lee ................ | 438/157 |
| 7,217,623 | B2* | 5/2007 | Kim et al. ........ | 438/283 |
| 7,368,348 | B2* | 5/2008 | Lee ................ | 438/259 |
| 2007/0176245 | A1* | 8/2007 | Kim et al. ........ | 257/401 |
| 2007/0267676 | A1* | 11/2007 | Kim et al. ........ | 257/311 |
| 2008/0023754 | A1* | 1/2008 | Baek ............... | 257/330 |
| 2008/0251839 | A1* | 10/2008 | Lee ................ | 257/331 |
| 2009/0011584 | A1* | 1/2009 | Cho et al. ........ | 438/589 |
| 2009/0035916 | A1* | 2/2009 | Kim ................ | 438/424 |
| 2009/0101968 | A1* | 4/2009 | Sugioka ........... | 257/327 |
| 2009/0278183 | A1* | 11/2009 | Lee ................ | 257/296 |
| 2009/0294874 | A1* | 12/2009 | Lee ................ | 257/401 |
| 2010/0001340 | A1* | 1/2010 | Lee et al. ......... | 257/334 |
| 2010/0219467 | A1* | 9/2010 | Kim ................ | 257/330 |

* cited by examiner

*Primary Examiner* — Scott B Geyer
(74) *Attorney, Agent, or Firm* — Ladas & Parry LLP

(57) ABSTRACT

A semiconductor device includes a semiconductor substrate with an isolation layer formed in the semiconductor substrate to delimit active regions. Recess patterns for gates are defined in the active regions and the isolation layer. Gate patterns are formed in and over the recess patterns for gates, and a gate spacer is formed to cover the gate patterns. The recess patterns for gates have a first depth in the active regions and a second depth, which is greater than the first depth, in the isolation layer. Gaps are created between the gate patterns and upper parts of the recess patterns for gates that are defined in the isolation layer. The gate spacer fills the gaps and protects the gate spacer so as to prevent bridging.

33 Claims, 7 Drawing Sheets

SEMICONDUCTOR DEVICE HAVING SADDLE FIN-SHAPED CHANNEL AND METHOD FOR MANUFACTURING THE SAME

CROSS-REFERENCE TO RELATED APPLICATIONS

The present application claims priority to Korean patent application number 10-2008-0137358 filed on Dec. 30, 2008, which is incorporated herein by reference in its entirety.

BACKGROUND OF THE INVENTION

The present invention relates to a semiconductor device, and more particularly, to a semiconductor device having a saddle fin-shaped channel and a method for manufacturing the same.

Trends in the semiconductor industry have lead to a decrease in the design rule of a semiconductor device. This decrease has made it difficult to achieve the desired target threshold voltage when using a conventional planar channel structure. A semiconductor device with a three-dimensional channel structure has been suggested as a device with potential for overcoming the problems associated with the convention planar channel structure. Examples of a semiconductor device having a three-dimensional channel structure include semiconductor devices having a recess channel or a protrusion channel. Another such semiconductor device is the semiconductor device having a saddle fin-shaped channel, in which the recess channel and the protrusion channel are combined.

When compared to a conventional semiconductor device having a planar channel structure, the semiconductor device having the saddle fin-shaped channel realizes an increase in the effective channel length and an obtainable target threshold voltage. As a result of the increase in the effective channel width, current drivability can also be improved.

The semiconductor device having the saddle fin-shaped channel is structured such that the gate forming area in the active region is recessed to a first depth, and portions of an isolation layer which extend away from the gate forming area in the active region are recessed to a second depth greater than the first depth to expose front and rear surfaces of the gate forming area recessed to the first depth.

However, the isolation layer of the semiconductor device having the saddle fin-shaped channel comprises an oxide layer, and therefore; a pre-cleaning process is typically conducted immediately prior to forming the gate oxide layer using an HF solution. In this regard, enlargement of the recess pattern defined in the isolation layer is likely due to etch loss caused during the pre-cleaning process.

As a consequence, during a subsequent landing plug contact (LPC) process, the active region and the isolation layer can be etched together in the area where the plug of a bit line node is formed. Due to this fact, a self-align contact (SAC) fail, such as bridging between a gate pattern and an LPC plug, can occur, thereby leading to a decrease in manufacturing yield.

Therefore, in order to manufacture the semiconductor device having the saddle fin-shaped channel, it is necessary to prevent bridging between the gate pattern and the LPC plug.

SUMMARY OF THE INVENTION

Embodiments of the present invention include a semiconductor device which can prevent a bridge from occurring between a gate pattern and an LPC plug during the formation of a saddle fin-shaped channel, and a method for manufacturing the same.

Also, embodiments of the present invention include a semiconductor device in which the manufacturing yield is improved by preventing a bridge from occurring between a gate pattern and an LPC plug, and a method for manufacturing the same.

In one aspect of the present invention, a semiconductor device includes a semiconductor substrate; an isolation layer formed in the semiconductor substrate to delimit active regions; recess patterns for gates defined in the active regions and the isolation layer; gate patterns formed in and over the recess patterns for gates; and a gate spacer formed to cover the gate patterns. The recess patterns for gates have a first depth in the active regions and a second depth greater than the first depth in the isolation layer. Gaps are created between the gate patterns and upper parts of the recess patterns for gates, which are defined in the isolation layer, and the gate spacer fills the gaps.

The gate spacer may include a nitride layer.

The recess patterns for gates, which are defined in the isolation layer, have a width that is greater at the upper parts than lower parts of the recess patterns for gates.

The semiconductor device further comprises junction areas formed in surfaces of the active regions on both sides of the gate patterns; an interlayer dielectric formed on the gate spacer; and plugs formed in the interlayer dielectric to contact the junction areas.

The plugs include plugs formed to contact both the active regions and the isolation layer.

The gate patterns are formed as line type gate patterns extending across the active regions and the isolation layer.

The gate patterns comprise saddle fin gates covering front and rear surfaces of the active regions.

In another aspect of the present invention, a method for manufacturing a semiconductor device includes the steps of forming active regions and an isolation layer on a semiconductor substrate such that the isolation layer delimits the active regions; etching the active regions and the isolation layer to a first depth; defining recess patterns for gates by additionally etching portions of the isolation layer which are etched to the first depth, to a second depth; enlarging a width of upper parts of the recess patterns for gates, which are defined in the isolation layer; forming gate patterns in and over the recess patterns for gates; and forming a gate spacer to cover the gate patterns. The gate patterns are formed to have a width less than that of the enlarged upper parts of the recess patterns for gates, which are defined in the isolation layer. The gate spacer fills the gaps that are created between the gate patterns and the enlarged upper parts of the recess patterns for gates, which are defined in the isolation layer.

The step of defining the recess patterns for gates comprises the steps of forming a sacrificial layer on the active regions and the isolation layer; forming a hard mask layer on the sacrificial layer; etching the hard mask layer such that hard mask patterns are formed to expose portions of the sacrificial layer under which recess patterns for gates are to be defined; etching the sacrificial layer, the active regions and the isolation layer to a first depth, using the hard mask patterns; etching additionally portions of the isolation layer which are etched to the first depth, to a second depth greater than the first depth; and removing the hard mask patterns.

The sacrificial layer may include an oxide layer.

The oxide layer is formed to a thickness in the range of 50~500 Å.

The hard mask layer may include an amorphous carbon layer.

The step of etching the active regions and the isolation layer to the first depth may be implemented using at least one main gas for etching silicon, which is selected among $Cl_2$, HBr and $BCl_3$; and at least one main gas for etching an oxide layer, which is selected among $C_xF_y$ ($1 \leq x \leq 5$, $4 \leq y \leq 8$), $C_xH_yF_z$ ($1 \leq x \leq 3$, $1 \leq y \leq 3$, $1 \leq z \leq 3$), $NF_3$ and $SF_6$. Further, the step of etching the active regions and the isolation layer to the first depth may be additionally implemented using at least one additive gas, which is selected among He, Ar, $H_2$, $N_2$ and $O_2$.

The step of secondly etching the portions of the isolation layer 204 which are primarily recessed to the first depth may be implemented using at least one main gas for etching an oxide layer, which is selected among $C_xF_y$ ($1 \leq x \leq 5$, $4 \leq y \leq 8$), $C_xH_yF_z$ ($1 \leq x \leq 3$, $1 \leq y \leq 3$, $1 \leq z \leq 3$), $NF_3$ and $SF_6$; and at least one additive gas, which is selected among He, Ar, $H_2$, $N_2$ and $O_2$.

The step of enlarging the width of the upper parts of the 20 recess patterns for gates, which are defined in the isolation layer, may be implemented through a dry cleaning process.

The dry cleaning process is conducted using a gas containing at least one of nitrogen, hydrogen and fluorine.

The dry cleaning process may be conducted in a state in which plasma is not applied, using $NH_3$, HF and Ar gases under a pressure of 60~120 mTorr at a temperature of 30~60° C. The $NH_3$ gas is flowed at a rate of 10~60 sccm, the HF gas is flowed at a rate of 10~60 sccm, and the Ar gas is flowed at a rate of 0~40 sccm.

Alternatively, the dry etching process may be conducted in a state in which direct plasma is applied, using $N_2$ and $H_2$ gases and an $NF_3$ or HF gas under a pressure of 500~1,000 mTorr with power of 500~3,000 W. The $N_2$ gas is flowed at a rate of 500~1,000 sccm, the $H_2$ gas is flowed at a rate of 200~500 sccm, and the $NF_3$ or HF gas is flowed at a rate of 50~400 sccm.

Alternatively, the dry etching process may be conducted in a state in which remote plasma is applied, using $NH_3$ and $NF_3$ gases and an $N_2$ or $H_2$ gas under a pressure of 200~400 Pa with power of 151,000~4,000 W. The $NH_3$ gas is flowed at a rate of 500~1,000 sccm, the $NF_3$ gas is flowed at a rate of 1,000~3,000 sccm, and the $N_2$ or $H_2$ gas is flowed at a rate of 500~3,000 sccm.

After the step of forming the gate patterns and before the step of forming the gate spacer, the method further includes the step of forming junction areas in surfaces of the active regions on both sides of the gate patterns.

The gate spacer may include a nitride layer.

The recess patterns for gates which are defined in the isolation layer have a width that is greater at the upper parts than lower parts of the recess patterns for gates.

After the step of forming the gate spacer, the method further includes the steps of forming an interlayer dielectric on the gate spacer; and forming plugs in the interlayer dielectric to contact the junction areas in the active regions.

The plugs include plugs formed to contact both the active regions and the isolation layer.

The gate patterns are formed as line type patterns which extend across the active regions and the isolation layer.

The gate patterns include saddle fin gates which cover front and rear surfaces of the active regions.

In still another aspect of the present invention, a method for manufacturing a semiconductor device includes the steps of forming active regions and an isolation layer on a semiconductor substrate such that the isolation layer delimits the active regions; etching the active regions and the isolation layer using sacrificial layer patterns and hard mask patterns and thereby defining recess patterns for gates; forming gate patterns in and over the recess patterns for gates; and forming a gate spacer to cover the gate patterns. The step of defining the recess patterns for gates includes the steps of etching the active regions and the isolation layer to a first depth, using the hard mask patterns, and additionally etching the isolation layer to a second depth through a blanket etching process using the sacrificial layer patterns while simultaneously enlarging a width of upper parts of the recess patterns for gates. The gate patterns are formed to have a width less than that of the enlarged upper parts of the recess patterns for gates, which are defined in the isolation layer, and the gate spacer fills the gaps that are created between the gate patterns and the enlarged upper parts of the recess patterns for gates, which are defined in the isolation layer.

The sacrificial layer patterns may include an oxide layer.

The oxide layer may be formed to a thickness of 100~1,000 Å.

The sacrificial layer patterns and the hard mask patterns are formed by the steps of forming a sacrificial layer on the active regions and the isolation layer; forming a hard mask layer on the sacrificial layer; and etching the sacrificial layer and the hard mask layer to expose areas in which the recess patterns for gates are to be defined.

The hard mask layer may include an amorphous carbon layer.

The amorphous carbon layer may be formed to a thickness of 1,000~3,000 Å.

Etching of the active regions and the isolation layer may be conducted using at least one main gas for etching silicon, which is selected among $Cl_2$, HBr and $BCl_3$; at least one main gas for etching an oxide layer, which is selected among $C_xF_y$ ($1 \leq x \leq 5$, $4 \leq y \leq 8$), $C_xH_yF_z$ ($1 \leq x \leq 3$, $1 \leq y \leq 3$, $1 \leq z \leq 3$), $NF_3$ and $SF_6$; and at least one additive gas, which is selected among He, Ar, $H_2$, $N_2$ and $O_2$.

The blanket etching process may be conducted such that a partial thickness or the entire thickness of the sacrificial layer patterns is removed together.

The blanket etching process may be conducted such that a thickness of 50~200 Å of the sacrificial layer patterns remains.

The blanket etching process may be conducted using at least one main etching gas which is selected among $C_xF_y$ ($1 \leq x \leq 5$, $4 \leq y \leq 8$), $C_xH_yF_z$ ($1 \leq x \leq 3$, $1 \leq y \leq 3$, $1 \leq z \leq 3$), $NF_3$ and $SF_6$ and at least one additive gas which is selected among $O_2$, Ar, He, HBr, $N_2$ and COS.

The blanket etching process may be conducted under a pressure of 2~50 mTorr with source power of 300~1,500 W and bias power of 30~1,000 W.

The sacrificial layer patterns, which remain after the blanket etching process, may be removed through a wet cleaning process using a chemical containing HF.

Alternatively, the sacrificial layer patterns, which remain 20 after the blanket etching process, may be removed through a dry cleaning process using a gas containing at least one of nitrogen, hydrogen and fluorine.

After the step of forming the gate patterns and before the step of forming the gate spacer, the method further includes the step of forming junction areas in surfaces of the active regions on both sides of the gate patterns.

After the step of forming the gate spacer, the method further includes the steps of forming an interlayer dielectric on the gate spacer; and forming plugs in the interlayer dielectric to contact the junction areas in the active regions.

The plugs include plugs formed to contact both the active regions and the isolation layer.

The recess patterns for gates, which are defined in the isolation layer, have a width that is greater at the upper parts than lower parts of the recess patterns for gates.

The gate patterns are formed as line type gate patterns which extend across the active regions and the isolation layer.

The gate patterns include saddle fin gates which cover front and rear surfaces of the active regions.

DESCRIPTION OF SPECIFIC EMBODIMENTS

Hereafter, specific embodiments of the present invention will be described in detail with reference to the accompanying drawings.

Figure 1:
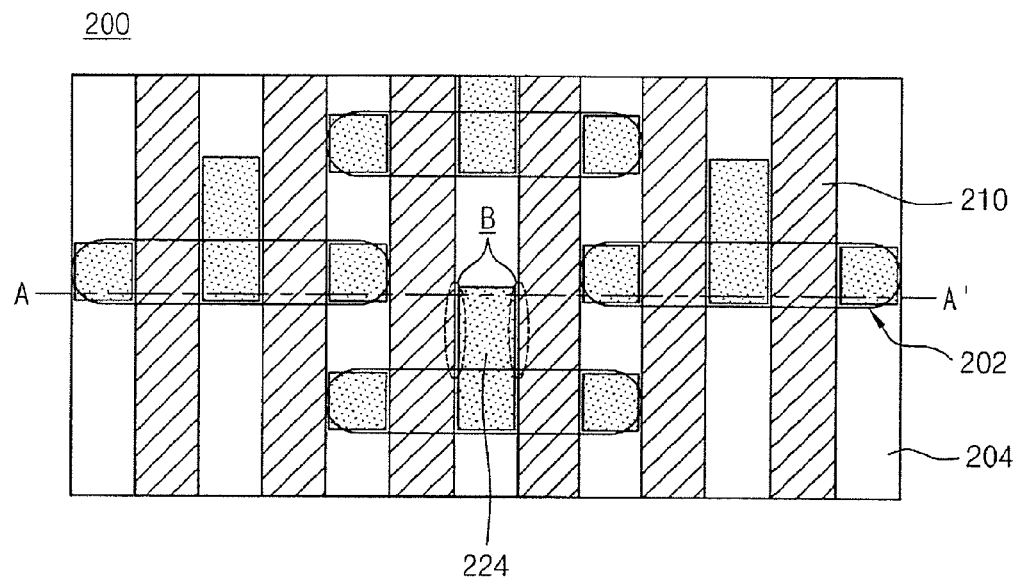
FIG. 1 is a plan view showing a semiconductor device in accordance with an embodiment of the present invention.
Figure 2:
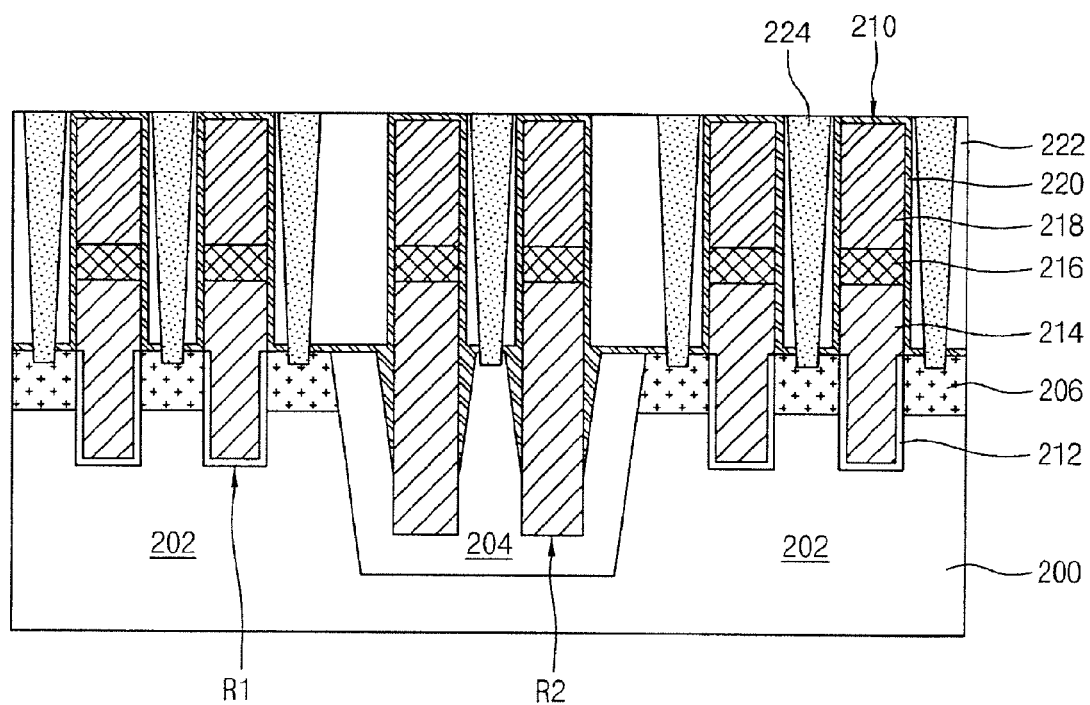
FIG. 2 is a cross-sectional view taken along the line A-A' of FIG. 1 and showing a semiconductor device in accordance with an embodiment of the present invention,.

FIG. 1 is a plan view showing a semiconductor device in accordance with an embodiment of the present invention, and FIG. 2 is a cross-sectional view taken along the line A-A' of FIG. 1.

Referring to FIGS. 1 and 2, an isolation layer 204 is formed in a semiconductor substrate 200 to delimit active regions 202. A plurality of first recess patterns R1 are defined to a first depth in gate forming areas of the active regions 202, and second recess patterns R2 are defined to a depth greater than the first depth in the portions of the isolation layer 204 that extend out from the gate forming areas of the active regions 202 such that the front and rear surfaces of the gate forming areas are exposed (e.g., portions of the active region at the front and rear of the gate forming areas of the active regions 202 are exposed) and saddle fin-shaped channels are formed. The second recess patterns R2, which are defined in the isolation layer 204, have a positive type recess profile in which the width of the recess is greater at the upper part than the lower part of the recess, as is shown in FIG. 2.

Gate patterns 210 are formed both in the gate forming areas of the active regions 202 in which the first recess patterns R1 are defined and in the portions of the isolation layer 204 extending out from the gate forming areas of the active regions 202 in which the second recess patterns R2 are defined. The gate patterns are formed as line type patterns extending across the active regions 202 and the isolation layer 204. The gate patterns 210 have a structure including a stack of a gate insulation layer 212, a first gate conductive layer 214 comprising polysilicon, a second gate conductive layer 216 comprising a metallic material such as tungsten, and a hard mask layer 218 comprising a nitride. The gate patterns 210 are formed to have a width less than that of the upper parts of the second recess patterns R2 such that gaps are created between the upper parts of the second recess patterns R2 and the gate patterns 210. Also, the respective gate patterns 210 are formed to have the shape of a saddle fin covering the front and rear surfaces of the gate forming areas.

Junction areas 206 are formed in the surfaces of the active regions 202 on both sides of the gate patterns 210, and a gate spacer 220 is formed on the semiconductor substrate 200 including on the gate patterns 210 and the isolation layer 204. The gate spacer 220 preferably comprises a nitride layer and is formed to a thickness capable of filling the gaps created between the upper parts of the second recess patterns R2 and the gate patterns 210. The gaps created between the upper parts of the second recess patterns R2 of the isolation layer 204 and the gate patterns 210 are thereby completely filled by the gate spacer 220.

An interlayer dielectric 222 is formed on the gate spacer 220, and plugs 224 are formed in the interlayer dielectric 222 to contact the junction areas 206. In one embodiment of the present invention, the plugs 224 are formed through an LPC process, and the respective plugs extend through the interlayer dielectric and in the active regions 202 or isolation layer 204. Portions of the gate spacer 220 are removed at places where the plugs 224 are formed and contact the junction areas 206 or portions of the isolation layer 204, as illustrated in FIG. 2. The plugs 224 include those plugs which are formed to contact both the active region 402 and the isolation layer 404, that is, the plugs of bit line nodes.

As a result, in the semiconductor device according to an embodiment of the present invention, the portions of the gate patterns 210 formed within the isolation layer 204 are protected by the gate spacer 220 including the portion of the gate spacer 220 that completely fills the gap formed between the upper parts of the second recess patterns R2 and the gate patters 210; and therefore, bridging between the plugs 224 of the bit line nodes and the gate patterns 210 can be prevented. Accordingly, in the semiconductor device according to the present embodiment, a self-align contact (SAC) fail can be avoided; and thereby, in a semiconductor device according to embodiments of the present invention, the manufacturing yield can be increased and the reliability can be improved.

FIGS. 3A through 3F are cross-sectional views shown for illustrating the processes of a method for manufacturing a semiconductor device in accordance with another embodiment of the present invention. The method will be described below.

Figure 3A:
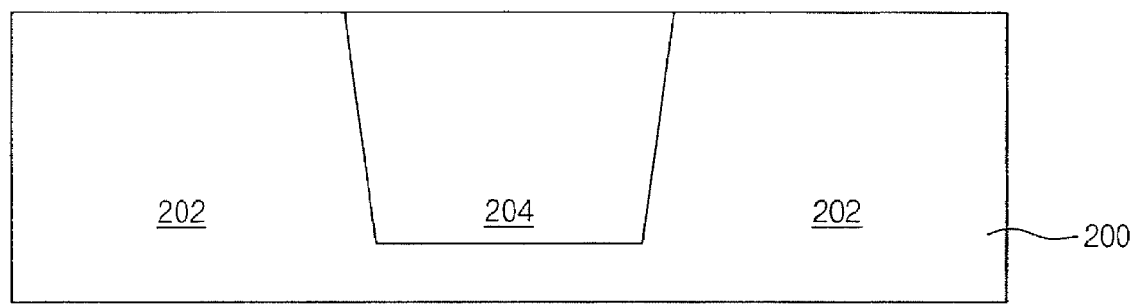
FIGS. 3A through 3F are cross-sectional views shown for illustrating the processes of a method for manufacturing a semiconductor device in accordance with another embodiment of the present invention.

Referring to FIG. 3A, an isolation layer 204 is formed in a semiconductor substrate 200 (which can be formed of, for example, bulk silicon) in such a way as to delimit active regions 202. Preferably, the isolation layer 204 is formed by filling trenches with an oxide layer using a shallow trench isolation (STI) process.

Figure 3B:
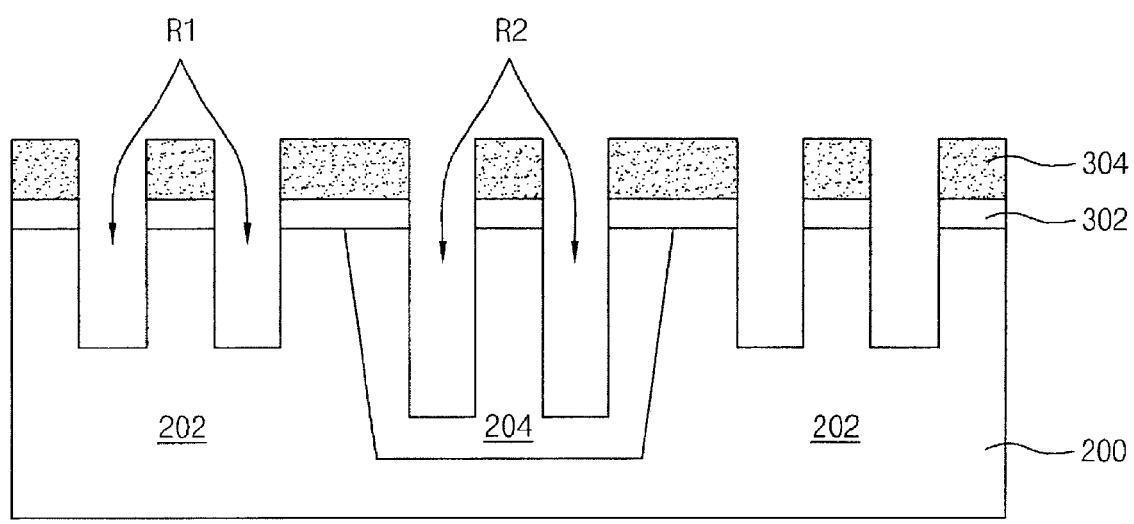

Referring to FIG. 3B, a sacrificial layer 302 comprising an oxide layer is formed on the semiconductor substrate 200 including on the isolation layer 204 to a thickness in the range of 50~500 Å, and a hard mask layer comprising an amorphous carbon layer is formed on the sacrificial layer 302. The hard mask layer is etched to form hard mask patterns 304 that expose portions of the sacrificial layer 302 located on the gate forming areas of the active regions 202 and the portions of the isolation layer 204 extending away from the gate forming areas of the active regions 202.

The sacrificial layer 302 is etched using the hard mask patterns 304 as an etch barrier. Then, the gate forming areas of the active regions 202 and the portions of the isolation layer 204 extending away from the gate forming areas are etched to a first depth to define first recess patterns R1 in the gate forming areas of the active regions 202 and recesses (which are of the first depth) in the isolation layer 204. Then, the portions of the isolation layer 204 (which have been initially recessed to the first depth) are again etched (secondarily etched) to define second recess patterns R2 having a second depth greater than the first depth in the portions of the isolation layer 204 extending away from the gate forming areas of the active regions 202.

In an embodiment of the present invention, the etching processes for defining the first and second recess patterns R1 and R2 are conducted using at least one main gas for etching silicon, which is selected among $Cl_2$, HBr and $BCl_3$; at least one main gas for etching an oxide layer, which is selected among $C_xF_y(1\leq x\leq 5, 4\leq y\leq 8)$, $C_xH_yF_z(1\leq x\leq 3, 1\leq y\leq 3, 1\leq z\leq 3)$, $NF_3$ and $SF_6$; and at least one additive gas, which is selected among He, Ar, $H_2$, $N_2$ and $O_2$.

Figure 3C:
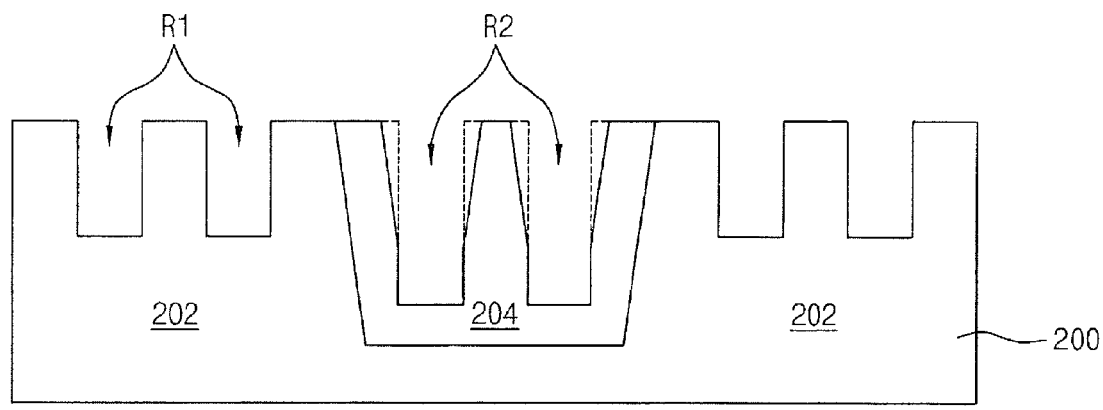

Referring to FIG. 3C, the hard mask patterns 304 comprising the amorphous carbon layer are removed. Then, a dry cleaning process is conducted on the resultant semiconductor substrate 200 having the hard mask patterns 304 removed therefrom to remove the remaining sacrificial layer 302; and at the same time, the upper portions of the portion of the isolation layer 204 recessed to a second depth, that is, the upper portions of the sidewalls of the second recess patterns R2, are partially removed such that the second recess patterns R2 have a positive type recess profile in which the width of the recesses is greater at the upper parts than the lower parts thereof. In an embodiment of the present invention, the dry cleaning process is conducted under conditions in which the oxide layer is removed by a thickness in the range of 50~600 Å, so that the width of the portions of the isolation layer 204 remaining between the second recess patterns R2 becomes 10~40 nm. Further, in an embodiment of the present invention, the dry cleaning process is conducted using a gas containing at least one of nitrogen, hydrogen and fluorine.

In detail, the dry cleaning process is conducted in a state in which plasma is not applied, using $NH_3$, HF and Ar gases under a pressure in the range of 60~120 mTorr at a temperature in the range of 30~60° C. At this time, the $NH_3$ gas is flowed at a rate of 10~60 sccm, the HF gas is flowed at a rate of 10~60 sccm, and the Ar gas is flowed at a rate of 0~40 sccm.

Additionally, it can be envisaged that the dry etching process is conducted in a state in which direct plasma is applied, using $N_2$ and $H_2$ gases and an $NF_3$ or HF gas under a pressure in the range of 500~1,000 mTorr with power of 500~3,000 W. At this time, the $N_2$ gas is flowed at a rate of 500~1,000 sccm, the $H_2$ gas is flowed at a rate of 200~500 sccm, and the $NF_3$ or HF gas is flowed at a rate of 50~400 sccm.

Further, it can be contemplated that the dry etching process is conducted in a state in which remote plasma is applied, using $NH_3$ and $NF_3$ gases and an $N_2$ or $H_2$ gas under a pressure in the range of 200~400 Pa with power of 1,000~4,000 W. At this time, the $NH_3$ gas is flowed at a rate of 500~1,000 sccm, the $NF_3$ gas is flowed at a rate of 1,000~3,000 sccm, and the $N_2$ or $H_2$ gas is flowed at a rate of 500~3,000 sccm.

After conducting the dry cleaning process, an additional wet cleaning process is conducted using an HF chemical in order to remove the oxide layer remaining at the bottom of the first and second recess patterns R1 and R2.

Figure 3D:
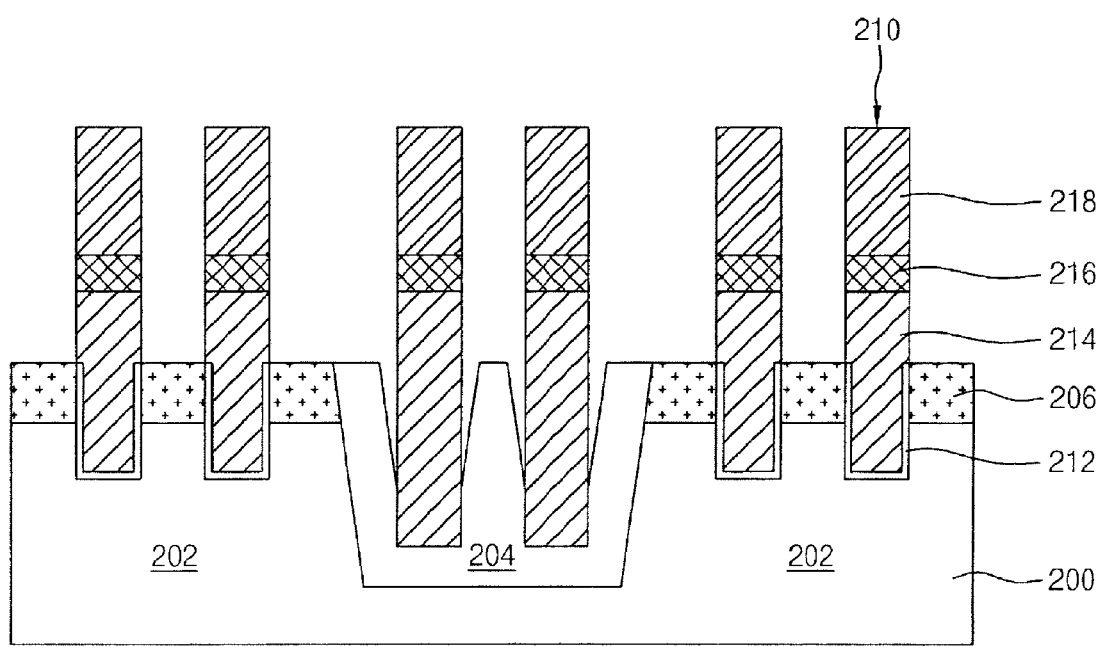

Referring to FIG. 3D, a gate insulation layer 212, a first gate conductive layer 214, a second gate conductive layer 216 and a gate hard mask layer 218 are sequentially formed on the entire surface of the semiconductor substrate 200 including on (and within in the case of the gate insulation layer 212 and the first gate conductive layer) the first recess patterns R1 and the second recess patterns R2 having the positive type recess profile. In an embodiment of the present invention, the first gate conductive layer 214 is formed using polysilicon, the second gate conductive layer 216 is formed using a metallic material such as tungsten, and the gate hard mask layer 218 is formed using a nitride.

The gate hard mask layer 218 is etched, and then by etching the second gate conductive layer 216, the first gate conductive layer 214 and the gate insulation layer 212 using the etched hard mask layer 218 as an etch barrier, gate patterns 210 are formed in the gate forming areas of the active regions 202 in which the first recess patterns R1 are defined and in the portions of the isolation layer 204 which extend from the gate forming areas in which the second recess patterns R2 are defined. The respective gate patterns 210 are formed as line type gate patterns which extend in the shape of a line in the active regions 202 and the isolation layer 204. Here, the gate patterns 210 are formed to have a width less than that of the upper parts of the second recess patterns R2 such that the lower parts of the second recess patterns R2 are completely filled by the gate patterns 210 while creating gaps between the upper parts of the second recess patterns R2 and the gate patterns 210. The gate patterns 210 are formed to cover the front and rear surfaces of the gate forming areas of the active regions 202. Junction areas 206 are formed in the surfaces of the active regions 202 on both sides of the gate patterns 210.

Figure 3E:
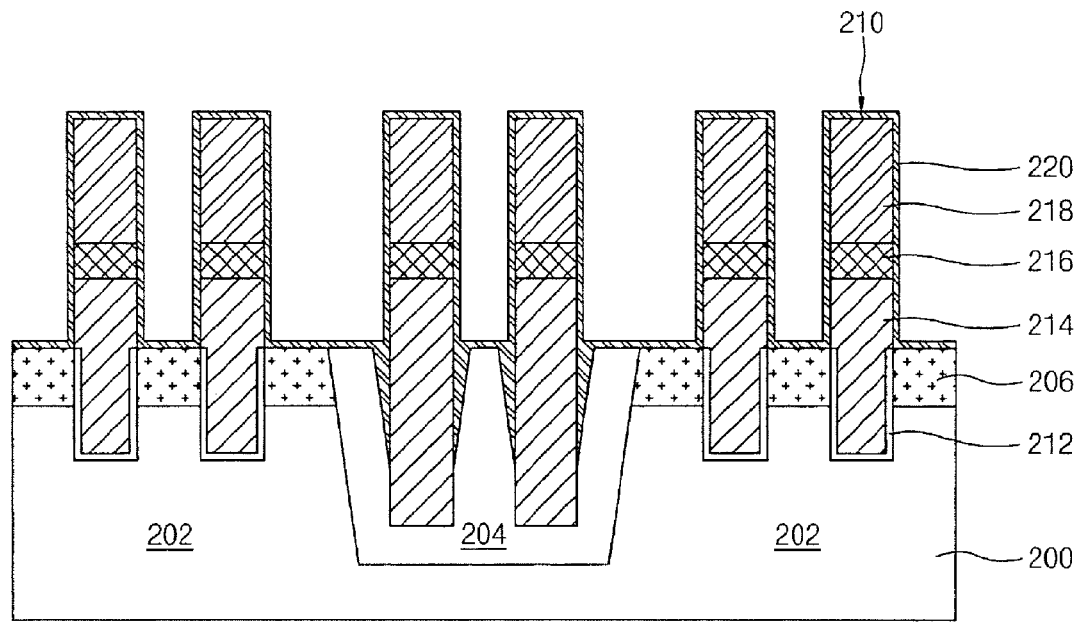

Referring to FIG. 3E, a gate spacer 220 is formed on the resultant semiconductor substrate 200 including on the gate patterns 210. Preferably, the gate spacer 220 comprises a nitride layer and is formed to a thickness capable of completely filling the gaps created between the upper parts of the second recess patterns R2 and the gate patterns 210. That is to say, the formation of the gate spacer 220 allows for the gaps between the upper parts of the second recess patterns R2 and the gate patterns 210 to be completely filled by the gate spacer 220. The gate spacer 220, which fills the gaps between the upper parts of the second recess patterns R2 and the gate patterns 210, serves to protect the gate patterns 210 during a subsequent LPC process (e.g., protects the device from a potential bridge).

Figure 3F:
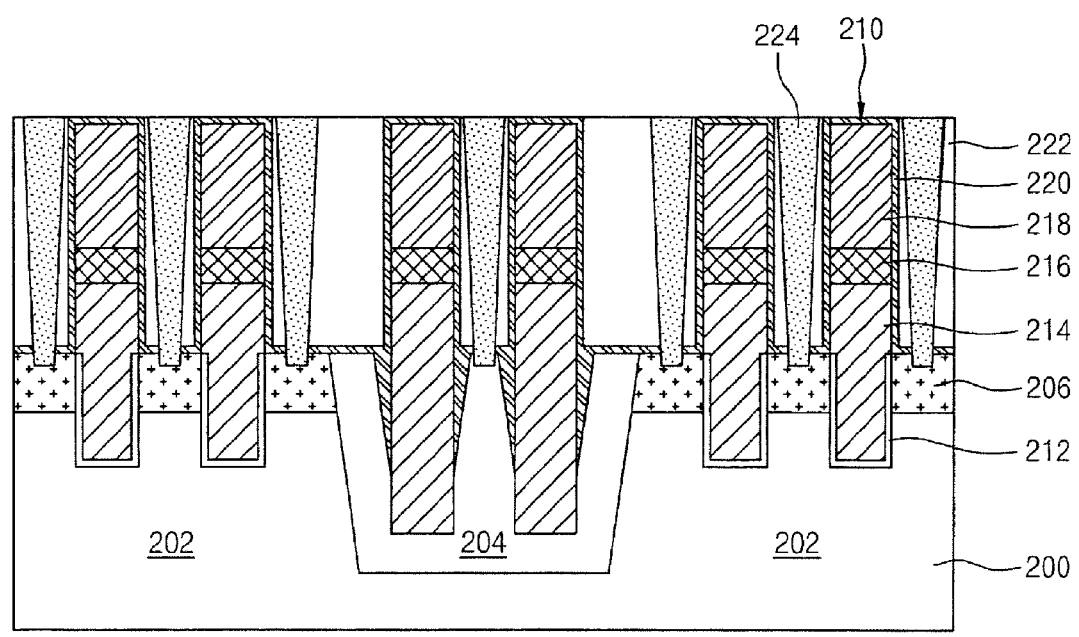

Referring to FIG. 3F, an interlayer dielectric 222 is formed on the semiconductor substrate including on the gate spacer 220. Then, plugs 224 are formed in the interlayer dielectric 222 on both sides of the gate patterns 210 through an LPC process in such a way as to contact the junction areas 206.

Here, when conducting the LPC process, as shown in FIG. 1, the active regions 202 and the isolation layer 204 are etched (e.g. etched simultaneously) at positions where the plugs 224 of bit line nodes are formed. As such, when a misalignment occurs, bridging between the gate patterns 210 and the plugs 224 is likely in the zone indicated by the reference character B. In this regard, in the present invention, the gate patterns 210 are protected from bridging by filling the gate spacer 220 in the gaps created between the upper parts of the second recess patterns R2 and the gate patterns 210. As such, in the present invention, even if a misalignment occurs, bridging between the gate patterns 210 and the plug 224 can be prevented in zone B.

Thus, in an embodiment of the present invention, because it is possible to prevent a bridge from forming between the gate patterns 210 and the plug 224, the manufacturing yield of the semiconductor device can be increased, and the reliability of a manufactured semiconductor device can be improved.

Thereafter, while not shown in the drawings, by sequentially conducting a series of subsequent processes, the manufacture of a semiconductor device according to the embodiment is completed.

FIGS. 4A through 4F are cross-sectional views shown for illustrating the processes of a method for manufacturing a semiconductor device in accordance with still another embodiment of the present invention.

Figure 4A:
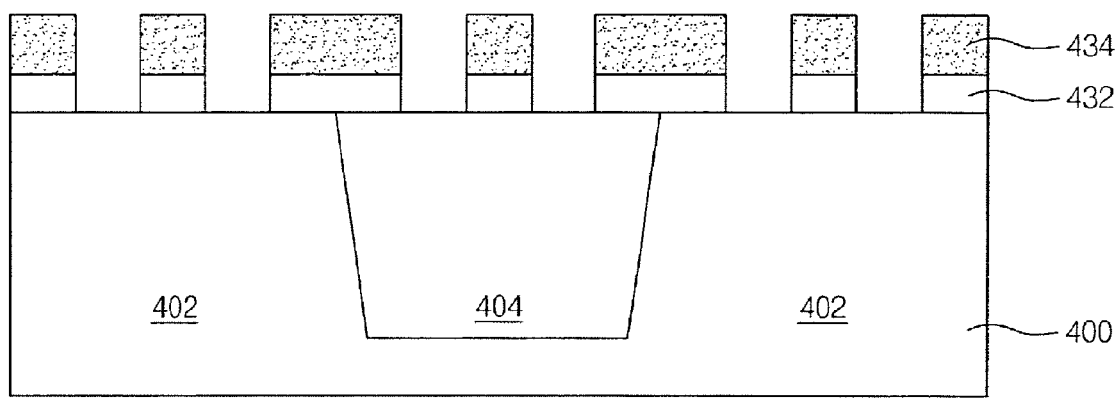
FIGS. 4A through 4F are cross-sectional views shown for illustrating the processes of a method for manufacturing a semiconductor device in accordance with still another embodiment of the present invention.

Referring to FIG. 4A, an isolation layer 404 is formed in a semiconductor substrate 400 (which can be formed of, for example, bulk silicon) in such a way as to delimit active regions 402. In one embodiment of the present invention, the isolation layer 404 is formed by filling trenches with an oxide layer using an STI process. A sacrificial layer 432 comprising an oxide layer is formed on the semiconductor substrate 400 including on the isolation layer 404 to a thickness in the range of 100~1,000 Å, and a hard mask layer comprising an amorphous carbon layer is formed on the sacrificial layer 432. Here, the sacrificial layer 432 comprising the oxide layer is formed the thickness greater than that in the embodiment previously conducted, since the active region 402 is protected by the sacrificial layer 432 in the a blanket etch process following. The hard mask layer is etched to form hard mask patterns 434 that expose portions of the sacrificial layer 432 located on the gate forming areas of the active regions 402 and the portions of the isolation layer 404 extending away from the gate forming areas of the active regions 402. Thereafter, the exposed portions of the sacrificial layer 432 are etched using the hard mask patterns 434 as an etch barrier to expose the gate forming areas of the active regions 402 and the portions of the isolation layer 404 extending away from the gate forming areas.

Here, the process for etching the hard mask layer comprising the amorphous carbon layer is conducted in a manner in which an SiON layer is formed on the hard mask layer as an anti-reflective layer; and thereafter, a photoresist pattern is formed on the SiON layer, and then the SiON layer and the hard mask layer are etched using the photoresist pattern as an etch barrier. The remaining photoresist pattern and the SiON layer are then removed.

Figure 4B:
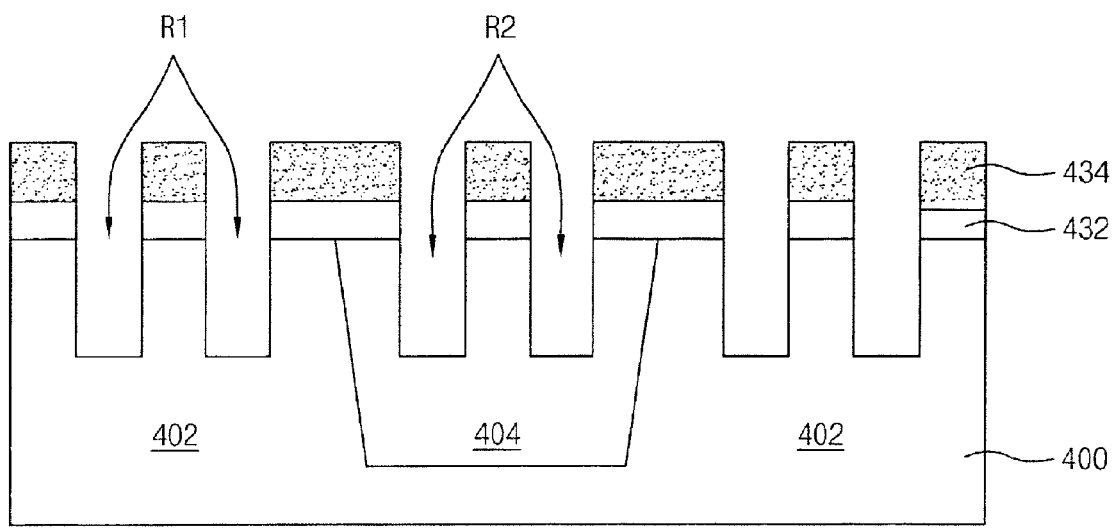

Referring to FIG. 4B, the exposed gate forming areas of the active regions 402 and the exposed portions of the isolation layer 404 extending from the gate forming areas are etched to a first depth using the hard mask patterns 434 as an etch barrier, and thereby first recess patterns R1 are defined in the gate forming areas of the active regions 402. At this time, the first recess patterns R1 are also defined in the isolation layer 404.

In an embodiment of the present invention, the process for defining the first recess patterns R1 is conducted using at least one main gas for etching silicon, which is selected among $Cl_2$, HBr and $BCl_3$; at least one main gas for etching an oxide layer, which is selected among $C_xF_y$ ($1 \leq x \leq 5$, $4 \leq y \leq 8$), $C_xH_yF_z$ ($1 \leq x \leq 3$, $1 \leq y \leq 3$, $1 \leq z \leq 3$), $NF_3$ and $SF_6$; and at least one additive gas, which is selected among He, Ar, $H_2$, $N_2$ and $O_2$.

Figure 4C:
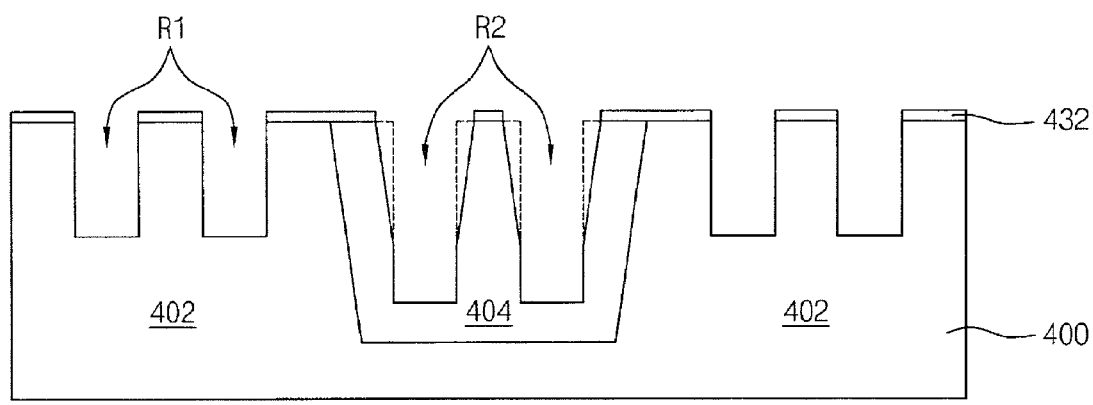

Referring to FIG. 4C, the hard mask patterns 434 comprising the amorphous carbon layer are removed. Then, a blanket etching process is conducted for the resultant semiconductor substrate 400 having removed therefrom the hard mask patterns 434. As a result of the blanket etching process, the portions of the isolation layer 404, which have been initially recessed to the first depth, are again etched (secondarily etched) in a manner such that second recess patterns R2 having a second depth greater than the first depth are defined in the portions of the isolation layer 404 that extend from the gate forming areas of the active regions 402, in such a way as to expose the front and rear surfaces of the gate forming areas recessed to the first depth, At this time, as the upper portions of the sidewalls of the second recess patterns R2 are etched, the second recess patterns R2 have a positive type recess profile in which the width of the recesses is greater at the upper parts than the width at the lower parts thereof. Further, as a result of the blanket etching process, a partial thickness or the entire thickness of the sacrificial layer 432 is removed.

Preferably, the blanket etching process is conducted such that a thickness in the range of 50~200 Å of the sacrificial layer 432 is removed.

In detail, the blanket etching process is conducted using at least one main etching gas which is selected among $C_xF_y$ ($1 \leq x \leq 5$, $4 \leq y \leq 8$), $C_xH_yF_z$ ($1 \leq x \leq 3$, $1 \leq y \leq 3$, $1 \leq z \leq 3$), $NF_3$ and $SF_6$ and at least one additive gas which is selected among $O_2$, Ar, He, HBr, $N_2$ and COS, under a pressure in the range of 2~50 mTorr with source power of 300~1,500 W and bias power of 30~1,000 W.

Figure 4D:
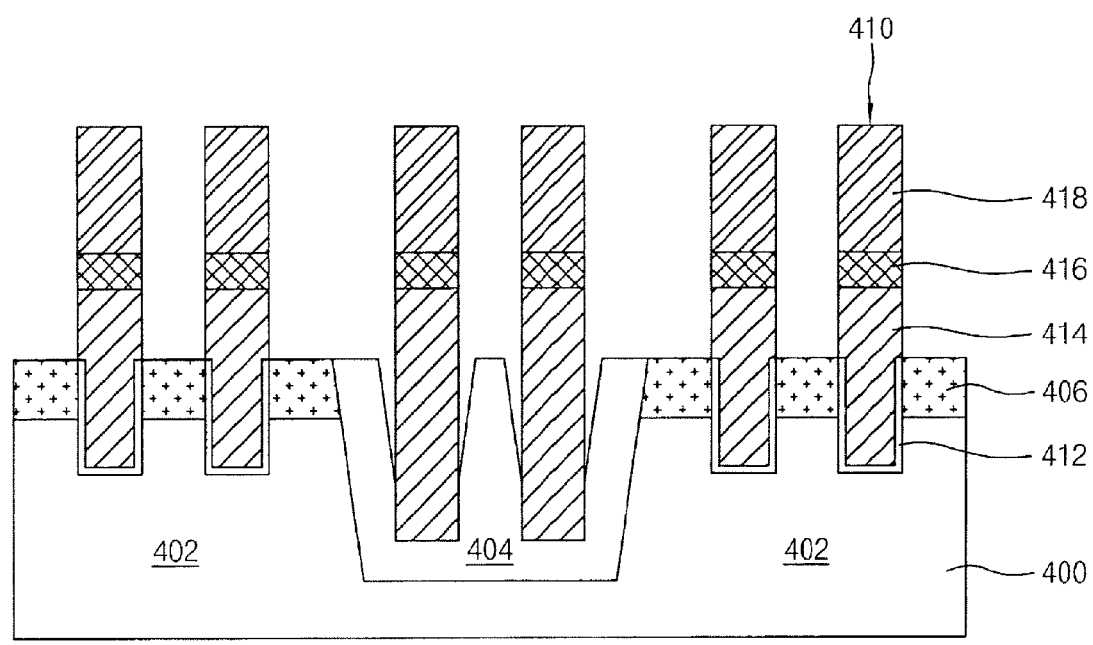

Referring to FIG. 4D, the remaining sacrificial layer 432 is removed. In an embodiment of the present invention, the process for removing the remaining sacrificial layer 432 is conducted through a wet cleaning process using a chemical containing HF or a dry cleaning process using a gas containing at least one of nitrogen, hydrogen and fluorine. While the cleaning process is being conducted, the oxide layer remaining on the bottoms of the first and second recess patterns R1 and R2 is removed simultaneously.

A gate insulation layer 412, a first gate conductive layer 414, a second gate conductive layer 416 and a gate hard mask layer 418 are sequentially formed on the entire surface of the semiconductor substrate 400 including on the first recess patterns R1 and the second recess patterns R2 having the positive type recess profile. The first gate conductive layer 414 is formed using polysilicon, the second gate conductive layer 416 is formed using a metallic material such as tungsten, and the gate hard mask layer 418 is formed using a nitride. The gate hard mask layer 418 is etched, and then by etching the second gate conductive layer 416, the first gate conductive layer 414 and the gate insulation layer 412 using the etched hard mask layer 418 as an etch barrier, a plurality of gate patterns 410 are formed in the gate forming areas of the active regions 402 in which the first recess patterns R1 are defined and in the portions of the isolation layer 404 which extend from the gate forming areas in which the second recess patterns R2 are defined. The respective gate patterns 410 are formed as line type gate patterns which extend in the shape of a line in the active regions 402 and the isolation layer 404. Junction areas 406 are formed in the surfaces of the active regions 402 on both sides of the gate patterns 410.

Here, the gate patterns 410 are formed to have a width less than that of the upper parts of the second recess patterns R2 such that the lower parts of the second recess patterns R2 are completely filled by the gate patterns 410 while creating gaps between the upper parts of the second recess patterns R2 and the gate patterns 410. The gate patterns 410 are formed as saddle fin gates to cover the front and rear surfaces of the gate forming areas of the active regions 402. In an embodiment of the present invention, the etching of the gate hard mask layer 418 and the second gate conductive layer 416 made of a metallic material is conducted using gases such as $CF_4$, $SF_6$, $NF_6$, $Cl_2$, $O_2$, Ar, He, HBr and $N_2$. It is preferred that the etching of the first gate conductive layer 414 made of polysilicon be conducted in the vertical direction such that the width of the upper parts of the second recess patterns R2 can be enlarged. To this end, the etching of the first gate conductive layer 414 made of polysilicon is conducted using a gas in which $Cl_2$, $O_2$, HBr, $N_2$, $NF_3$, $O_2$, $CH_2F_2$ and $CHF_3$ gases are appropriately mixed, with bias power of 0~100 W under a pressure in the range of 2~10 mTorr.

Figure 4E:
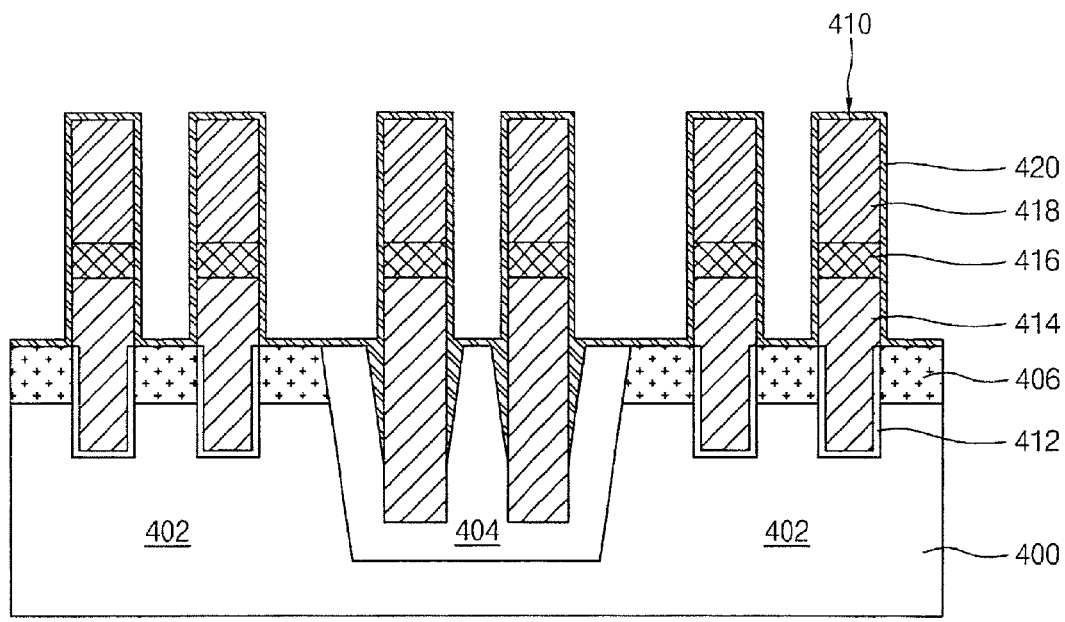

Referring to FIG. 4E, a gate spacer 420 comprising a nitride is formed on the resultant semiconductor substrate 400 including on the gate patterns 410. The gate spaces 420 is formed to a thickness capable of completely filling the gaps created between the upper parts of the second recess patterns R2 and the gate patterns 410. That is to say, the formation of the gate spacer 420 allows for the gaps between the upper parts of the second recess patterns R2 and the gate patterns 410 to be completely filled by the gate spacer 420. As a result, the portions of the gate patterns 410, which are filled in the second recess patterns R2 of the isolation layer 404, are protected by the gate spacer 420 which completely fills the gap.

Figure 4F:
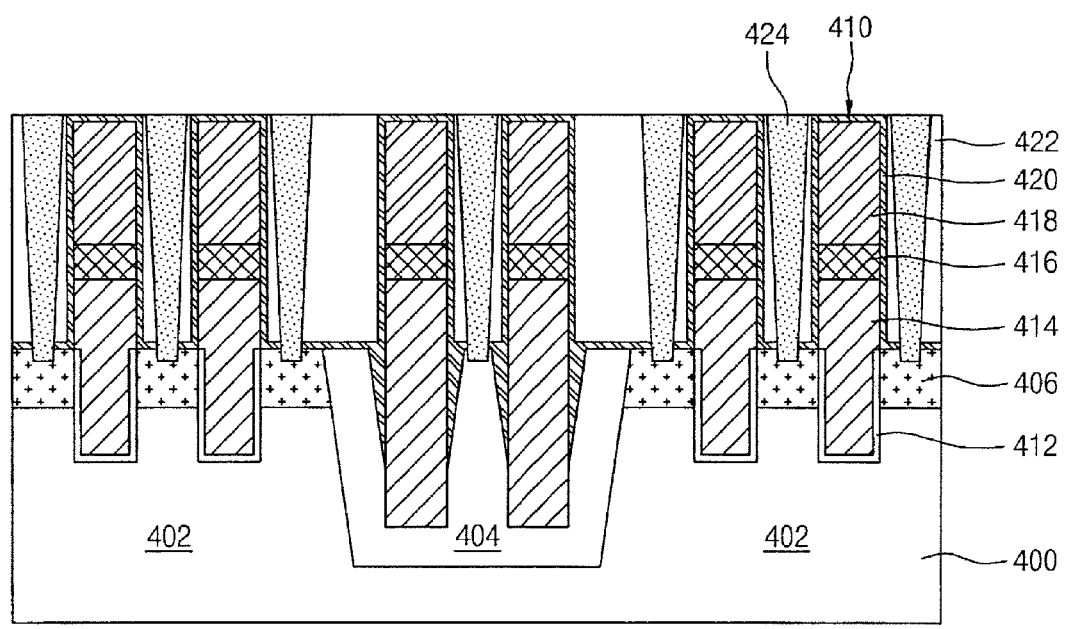

Referring to FIG. 4F, an interlayer dielectric 422 is formed on the semiconductor substrate 400 including on the gate spacer 420. Then, plugs 424 are formed in the interlayer dielectric 422 on both sides of the gate patterns 410 through an LPC process in such a way as to contact the junction areas 406. The plugs 424 include those plugs which are formed to contact both the active region 402 and the isolation layer 404 (see FIG. 1), that is, the plugs of bit line nodes.

Here, when conducting the LPC process, since the plugs 424 of the bit line nodes are protected by the gate spacer 420, bridging between the gate patterns 410 and the plug 424 is prevented. Thus, in an embodiment of the present invention, because it is possible to prevent a bridge from forming between the gate patterns 410 and the plug 424, the manufacturing yield of the semiconductor device can be increased, and the reliability of a manufactured semiconductor device can be improved.

Thereafter, while not shown in the drawings, by sequentially conducting a series of subsequent processes, the manufacture of a semiconductor device according to the embodiment is completed.

As is apparent from the above description, in the present invention, upper portions of an isolation layer are additionally removed on both sidewalls of a recess defined in the isolation layer such that the width of the recess is greater at the upper part than the lower part of the recess, and a gate pattern is formed in the recess to have a width less than the width of the upper part of the recess. Further, a gate spacer is filled in spaces defined between the upper parts of the recessed isolation layer and the gate pattern.

As a result, in the present invention, the sidewalls of the gate pattern are protected by the gate spacer; and therefore, it is possible to prevent a bridge from occurring between the gate pattern and an LPC plug during a subsequent LPC process, whereby the manufacturing yield of a semiconductor device can be increased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a semiconductor substrate;
an isolation layer formed in the semiconductor substrate to delimit active regions;
a plurality of recess patterns for gates defined in the active regions and the isolation layer, wherein the recess patterns have a first depth in the active region and a second depth in the isolation layer, the second depth being greater than the first depth;
gate patterns formed in and over the recess patterns for gates; and
gaps between the gate patterns and sidewalls of the recess patterns defined in the isolation layer;
a gate spacer covering the gate patterns and filling the gaps between the gate patterns and the at least upper parts of sidewalls of the recess patterns.

2. The semiconductor device according to claim 1, wherein the gate spacer comprises a nitride layer.

3. The semiconductor device according to claim 1, wherein a width of the upper parts of the recess patterns defined in the isolation layer is greater than a width of lower parts of the recess patterns such that the gaps are created between the gate patterns and the upper parts of the sidewalls of the recess patterns in the isolation layer.

4. The semiconductor device according to claim 1, further comprising:
junction areas formed in surfaces of the active regions on both sides of the gate patterns;
an interlayer dielectric formed on the semiconductor substrate including the gate spacer and the junction areas; and
plugs formed in the interlayer dielectric to contact the junction areas.

5. The semiconductor device according to claim 4, wherein the plugs include plugs formed to contact both the active region and the isolation layer.

6. A method for manufacturing a semiconductor device, comprising the steps of:
forming an isolation layer on a semiconductor substrate to delimit active regions;
etching the active regions and the isolation layer to define recesses having a first depth;
etching the recesses having the first depth that are defined in the isolation layer to form recesses having a second depth such that recess patterns for gates having a first depth in the active region and a second depth in the isolation layer are defined;
enlarging a width of upper parts of the recess patterns for gates defined in the isolation layer;
forming gate patterns in and over the recess patterns for gates, the respective gate patterns having a width less than that of the enlarged upper part of the respective recess patterns in the isolation layer such that gaps are created at least between the gate patterns and the enlarged upper parts of the recess patterns for gates defined in the isolation layer; and
forming a gate spacer to cover the gate patterns and to fill the gaps.

7. The method according to claim 6, wherein the step of defining the recess patterns for gates comprises the steps of:
forming a sacrificial layer on the active regions and the isolation layer;
forming a hard mask layer on the sacrificial layer;
etching the hard mask layer such that hard mask patterns are formed to expose portions of the sacrificial layer under which recess patterns for gates are to be defined;
etching the sacrificial layer, the active regions and the isolation layer to form the recesses having the first depth using the hard mask patterns;
etching the recesses having the first depth that are defined in the isolation layer to form the recesses having the second depth in the isolation layer, the second depth being greater than the first depth; and
removing the hard mask patterns.

8. The method according to claim 7, wherein the sacrificial layer comprises an oxide layer.

9. The method according to claim 7, wherein the oxide layer is formed to a thickness in the range of 50~500 Å.

10. The method according to claim 7, wherein the hard mask layer comprises an amorphous carbon layer.

11. The method according to claim 6, wherein the step of enlarging the width of the upper parts of the recess patterns for gates defined in the isolation layer is implemented through a dry cleaning process.

12. The method according to claim 11, wherein the dry cleaning process is conducted in a state in which plasma is not applied, using $NH_3$, HF and Ar gases under a pressure in the range of 60~120 mTorr at a temperature in the range of 30~60° C.

13. The method according to claim 11, wherein the dry etching process is conducted in a state in which direct plasma is applied, using $N_2$ and $H_2$ gases and an $NF_3$ or HF gas under a pressure in the range of 500~1,000 mTorr with power in the range of 500~3,000 W.

14. The method according to claim 11, wherein the dry etching process is conducted in a state in which remote plasma is lo applied, using $NH_3$ and $NF_3$ gases and an $N_2$ or $H_2$ gas under a pressure in the range of 200~400 Pa with power in the range of 1,000~4,000 W.

15. The method according to claim 6, further comprising the step of:
after the step of forming the gate patterns and before the step of forming the gate spacer, forming junction areas in surfaces of the active regions on both sides of the gate patterns.

16. The method according to claim 6, wherein the gate spacer comprises a nitride layer.

17. The method according to claim 6, wherein the width of the upper parts of the recess patterns for gates defined in the isolation layer is greater than a width of lower parts of the recess patterns for gates, such that the gaps are created between the gate patterns and the upper parts of the recess patterns for gates in the isolation layer.

18. The method according to claim 6, wherein:
after the step of forming the gate spacer:
forming an interlayer dielectric on the semiconductor substrate including the gate spacer; and
forming plugs in the interlayer dielectric to contact the junction areas in the active regions.

19. The method according to claim 18, wherein the plugs include plugs formed to contact both the active regions and the isolation layer.

20. A method for manufacturing a semiconductor device, comprising the steps of:
forming an isolation layer on a semiconductor substrate to delimit active regions;
etching the active regions and the isolation layer using sacrificial layer patterns and hard mask patterns to define recess patterns for gates;
forming gate patterns in and over the recess patterns for gates; and
forming a gate spacer to cover the gate patterns,
wherein the step of defining the recess patterns for gates comprises the steps of:
etching the active regions and the isolation layer to define recesses having a first depth using the hard mask patterns; and
etching the recesses having the first depth in the isolation layer to form recesses having a second depth in the isolation layer through a blanket etching process using the sacrificial layer patterns while simultaneously enlarging a width of upper parts of the recess patterns for gates,
wherein the gate patterns are formed to have a width less than that of the enlarged upper parts of the recess patterns for gates such that gaps are created at least between the gate patterns and the enlarged upper parts of the recess patterns for gates defined in the isolation layer, and
wherein the gate spacer fills the gaps between the gate patterns and the enlarged upper parts of the recess patterns for gates defined in the isolation layer.

21. The method according to claim 20, wherein the sacrificial layer patterns comprise an oxide layer.

22. The method according to claim 21, wherein the oxide layer is formed to a thickness in the range of 100~1,000 Å.

23. The method according to claim 20, further comprising:
forming a sacrificial layer on the active regions and the isolation layer;
forming a hard mask layer on the sacrificial layer; and
etching the sacrificial layer and the hard mask layer to form the sacrificial layer patterns and the hard mask layer patterns such that the sacrificial layer patterns and the hard mask layer patterns expose areas in which the recess patterns for gates are to be defined.

24. The method according to claim 23, wherein the hard mask layer comprises an amorphous carbon layer.

25. The method according to claim 24, wherein the amorphous carbon layer is formed to a thickness in the range of 1,000~3,000 Å.

26. The method according to claim 20, wherein the blanket etching process is conducted such that a partial thickness or the entire thickness of the sacrificial layer patterns is removed as the recesses having the first depth are etched.

27. The method according to claim 20, wherein the blanket etching process is conducted such that a thickness in the range of 50~200 Å of the sacrificial layer patterns remains.

28. The method according to claim 20, wherein the blanket etching process is conducted using at least one main etching gas of $C_xF_y (1 \leq x \leq 5, 4 \leq y \leq 8)$, $C_xH_yF_z (1 \leq x \leq 3, 1 \leq y \leq 3, 1 \leq z \leq 3)$, $NF_3$ and $SF_6$ and at least one additive gas of $O_2$, Ar, He, HBr, $N_2$ and COS.

29. The method according to claim 28, wherein the blanket etching process is conducted under a pressure in the range of 2~50 mTorr with source power of 300~1,500 W and bias power of 30~1,000 W.

30. The method according to claim 20, further comprising the step of:
after the step of forming the gate patterns and before the step of forming the gate spacer, forming junction areas in surfaces of the active regions on both sides of the gate patterns.

31. The method according to claim 20, further comprising the steps of:
after the step of forming the gate spacer:
forming an interlayer dielectric on the gate spacer; and
forming plugs in the interlayer dielectric to contact the junction areas in the active regions.

32. The method according to claim 31, wherein the plugs include plugs formed to contact both the active regions and the isolation layer.

33. The method according to claim 20, wherein the width of the upper parts of the recess patterns for gates defined in the isolation layer is greater than a width of lower parts of the recess patterns for gates, such that the gaps are created between the gate patterns and the upper parts of the recess patterns for gates in the isolation layer.

* * * * *